United States Patent
Kang (10) Patent No.: US 7,369,423 B2
(45) Date of Patent: May 6, 2008

(54) NONVOLATILE MEMORY DEVICE USING HYBRID SWITCH CELL

(75) Inventor: Hee Bok Kang, Daejeongwangyeok-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 506 days.

(21) Appl. No.: 11/049,682

(22) Filed: Feb. 4, 2005

(65) Prior Publication Data

US 2005/0175086 A1 Aug. 11, 2005

(30) Foreign Application Priority Data

Feb. 5, 2004 (KR) .................. 10-2004-0007558

(51) Int. Cl.
*G11C 11/22* (2006.01)
(52) U.S. Cl. .................. 365/145; 365/189.11; 365/196
(58) Field of Classification Search ................ 365/145, 365/228, 189.11, 196, 65
See application file for complete search history.

(56) References Cited

U.S. PATENT DOCUMENTS

| 6,272,594 | B1 | 8/2001 | Gupta et al. | |
|---|---|---|---|---|
| 6,363,439 | B1 | 3/2002 | Battles et al. | |
| 6,775,172 | B2 * | 8/2004 | Kang et al. | 365/145 |
| 7,072,203 | B2 * | 7/2006 | Kang | 365/145 |
| 7,167,386 | B2 * | 1/2007 | Matsushita | 365/145 |

* cited by examiner

*Primary Examiner*—Gene N. Auduong
(74) *Attorney, Agent, or Firm*—Townsend and Townsend and Crew LLP (57) ABSTRACT

A nonvolatile memory device using a hybrid switch cell comprises a plurality of hybrid switch cell arrays each having a hierarchical bit line structure including a main bit line and a sub bit line. In the nonvolatile memory device, each sub cell array having the hierarchical bit line structure including a main bit line and a sub bit line is provided as a cross point cell array that comprises a nonvolatile ferroelectric capacitor and a hybrid switch which does not require an additional gate control signal, thereby reducing the whole memory size.

11 Claims, 10 Drawing Sheets

NONVOLATILE MEMORY DEVICE USING HYBRID SWITCH CELL

BACKGROUND ART

1. Field of the Invention

The present invention generally relates to a nonvolatile memory device using a hybrid switch cell, and more specifically, to a technology of reducing the size of a sub cell array in a hierarchical bit line structure including a main bit line and a sub bit line.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of the conventional FeRAM comprises a switching device and a nonvolatile ferroelectric capacitor which is connected between one terminal of the switching device and a plate line. The switching device performs a switching operation depending on a state of a word line to connect the nonvolatile ferroelectric capacitor to a sub bit line.

Here, the switching device of the conventional FeRAM is generally a NMOS transistor whose switching operation is controlled by a gate control signal. However, when a cell array is embodied by using the above-described NMOS transistor as a switching device, the whole chip size increases.

As a result, it is necessary to provide a sub cell array as a cross point cell array having a hierarchical bit line structure including a main bit line and a sub bit line by using a hybrid switch cell which does not require a gate control signal, thereby reducing the size of the chip.

SUMMARY OF THE INVENTION

Accordingly, it is an object of the present invention to provide a sub cell array using a hybrid switch which does not require an additional gate control signal in a hierarchical bit line structure including a main bit line and a sub bit line, thereby reducing the whole memory size.

It is another object of the present invention to effectively drive read/write operations in the sub cell array using a hybrid switch, thereby improving operation characteristics of memory cells.

In an embodiment, a nonvolatile memory device using a hybrid switch cell comprises a plurality of hybrid switch cell arrays, a plurality of word line driving units and a plurality of sense amplifiers. Each of the plurality of hybrid switch cell arrays has a hierarchical bit line structure including a main bit line and a sub bit line, and includes a sub cell array having a plurality of unit hybrid switch cells arranged in row and column directions between a word line and the sub bit line. The plurality of word line driving units selectively drive the word lines of the plurality of hybrid switch cell arrays. The plurality of sense amplifiers sense and amplify data applied from the plurality of hybrid switch cell arrays. Here, each of the unit hybrid switch cell comprises a nonvolatile ferroelectric capacitor whose one terminal is connected to the word line, and a hybrid switch which is connected between the other terminal of the nonvolatile ferroelectric capacitor and the sub bit line and is selectively switched depending on a voltage applied to the word line and the sub bit line.

In another embodiment, a nonvolatile memory device using a hybrid switch cell comprises a plurality of hybrid switch cell arrays. Each of the plurality of hybrid switch cell arrays has a hierarchical bit line structure including a main bit line and a sub bit line, and includes a sub cell array having a plurality of unit hybrid switch cells which are arranged in row and column directions between a word line and the sub bit line. Here, the sub cell array comprises a unit hybrid switch cell, a pull-up/pull-down switch, a first driving switch unit and a second driving switch unit. The unit hybrid switch cell includes a nonvolatile ferroelectric capacitor whose one terminal is connected to the word line, and a hybrid switch which is connected between the other terminal of the nonvolatile ferroelectric capacitor and the sub bit line and is selectively switched depending on a voltage applied to the word line and the sub bit line. The pull-up/pull-down driving switch pulls up or pulls down the sub bit line. The first driving switch unit controls connection between the main bit line and the sub bit line. The second driving switch unit pulls down the main bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
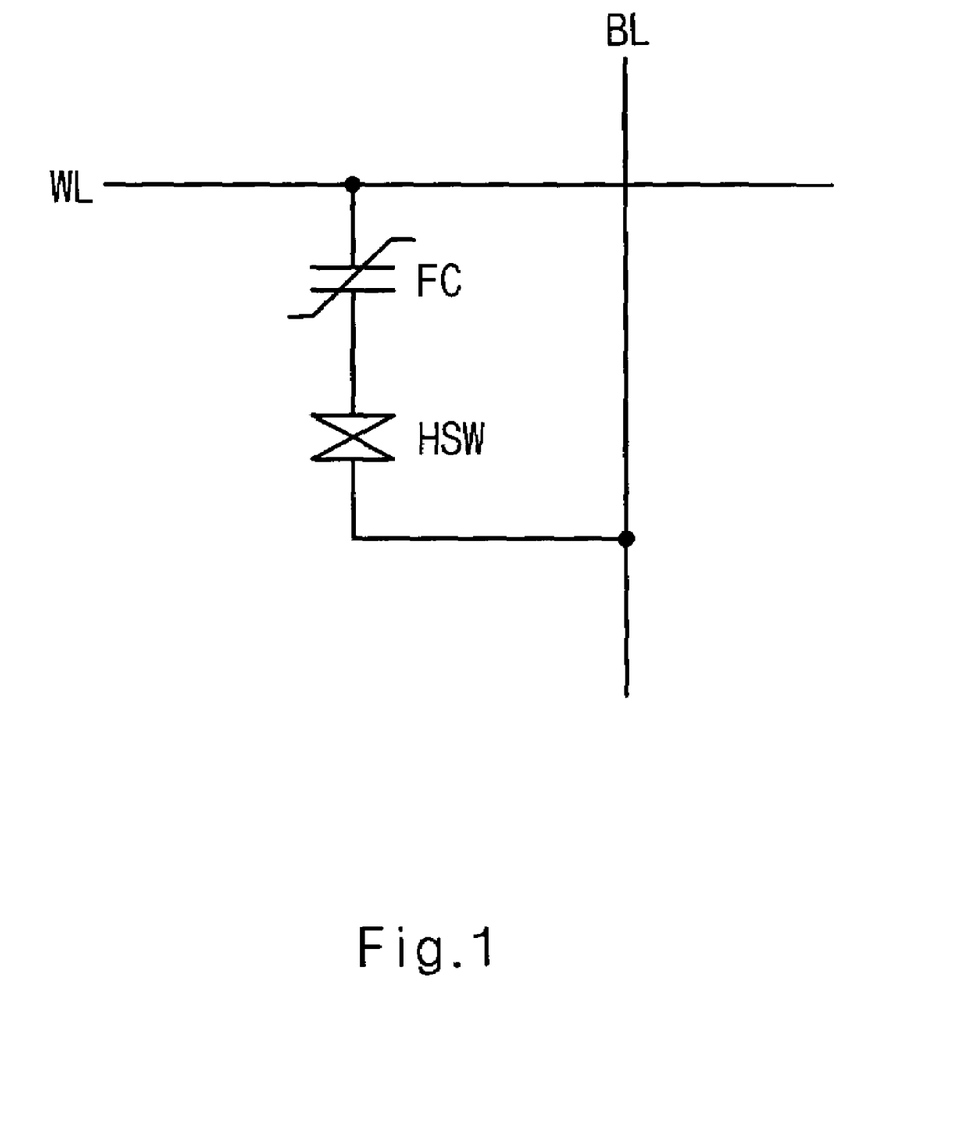
FIG. 1 is a diagram illustrating a hybrid switch cell according to an embodiment of the present invention.

FIG. 1 is a diagram illustrating a hybrid switch cell according to an embodiment of the present invention.

In an embodiment, a unit hybrid switch cell comprises a nonvolatile ferroelectric capacitor FC and a hybrid switch HSW which are connected serially. Here, the hybrid switch HSW is connected between a bit line BL and one electrode of the nonvolatile ferroelectric capacitor FC, and the other electrode of the nonvolatile ferroelectric capacitor FC is connected to a word line WL.

In a hierarchical bit line structure including a main bit line MBL and a sub bit line SBL, it is supposed that the above-described bit line BL is the same as a sub bit line SBL described later.

Figure 2:
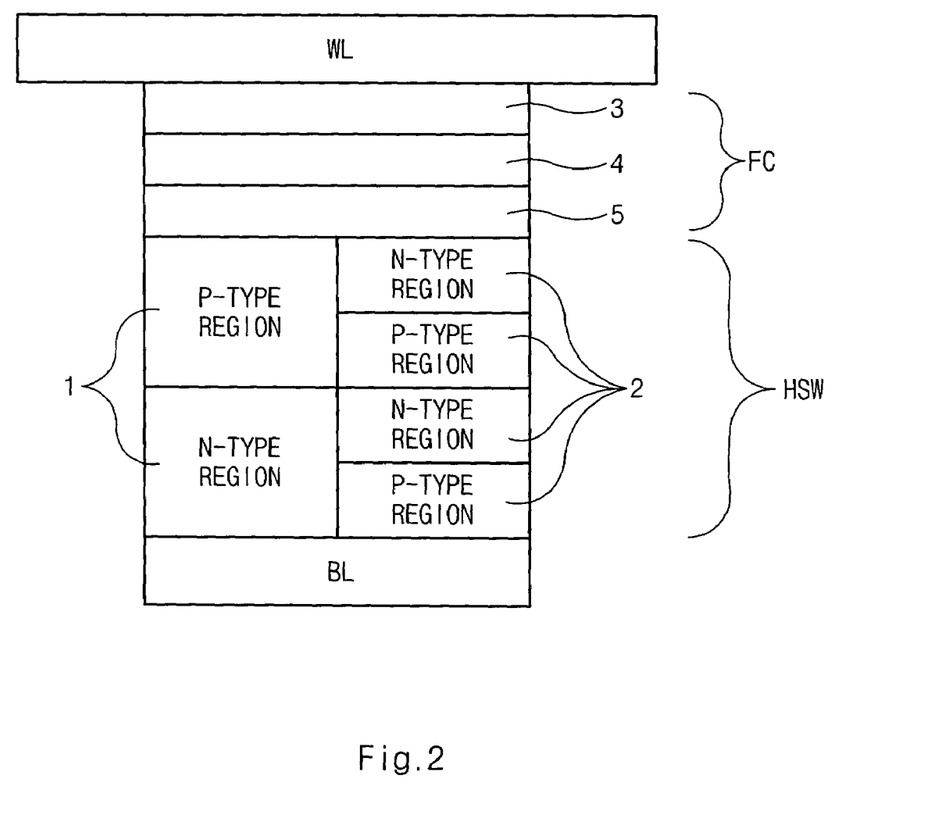
FIG. 2 is a cross-sectional diagram illustrating a hybrid switch cell according to an embodiment of the present invention.

FIG. 2 is a cross-sectional diagram illustrating a hybrid switch cell according to an embodiment of the present invention.

The hybrid switch HSW comprises a PN diode switch 1 and a PNPN diode switch 2 that are connected in parallel between one electrode of the nonvolatile ferroelectric capacitor FC and one electrode of the bit line BL.

Here, the PN diode switch 1 has a P-type region deposited on a N-type region. The P-type region of the PN diode switch 1 is connected to one electrode of the nonvolatile ferroelectric capacitor FC, and the N-type region of the PN diode switch 1 is connected to one electrode of the bit line BL.

The PNPN diode switch 2 has an upper N-type region deposited on a P-type region deposited on a N-type region deposited on a lower P-type region. The upper N-type region of the PNPN diode switch 2 is connected to one electrode of the nonvolatile ferroelectric capacitor FC, and the lower P-type region of the PNPN diode switch 2 is connected to one electrode of the bit line BL.

The above-described hybrid switch HSW is represented by the symbol shown in FIG. 1.

The hybrid switch HSW is deposited on the bit line BL of the unit hybrid switch cell, and the nonvolatile ferroelectric capacitor FC is deposited on the hybrid switch HSW. The word line WL is connected on the nonvolatile ferroelectric capacitor FC.

Here, the nonvolatile ferroelectric capacitor FC comprises a top electrode 3, a ferroelectric film 4, a bottom electrode 5. The top electrode 3 of the nonvolatile ferroelectric capacitor FC is connected to the word line WL, and the bottom electrode 5 is connected to the P-type region of the PN diode switch 1 and the upper N-type region of the PNPN diode switch 2.

Also, the bit line BL is connected to the N-type region of the PN diode switch 1 and the lower P-type region of the PNPN diode switch 2.

Figure 3:
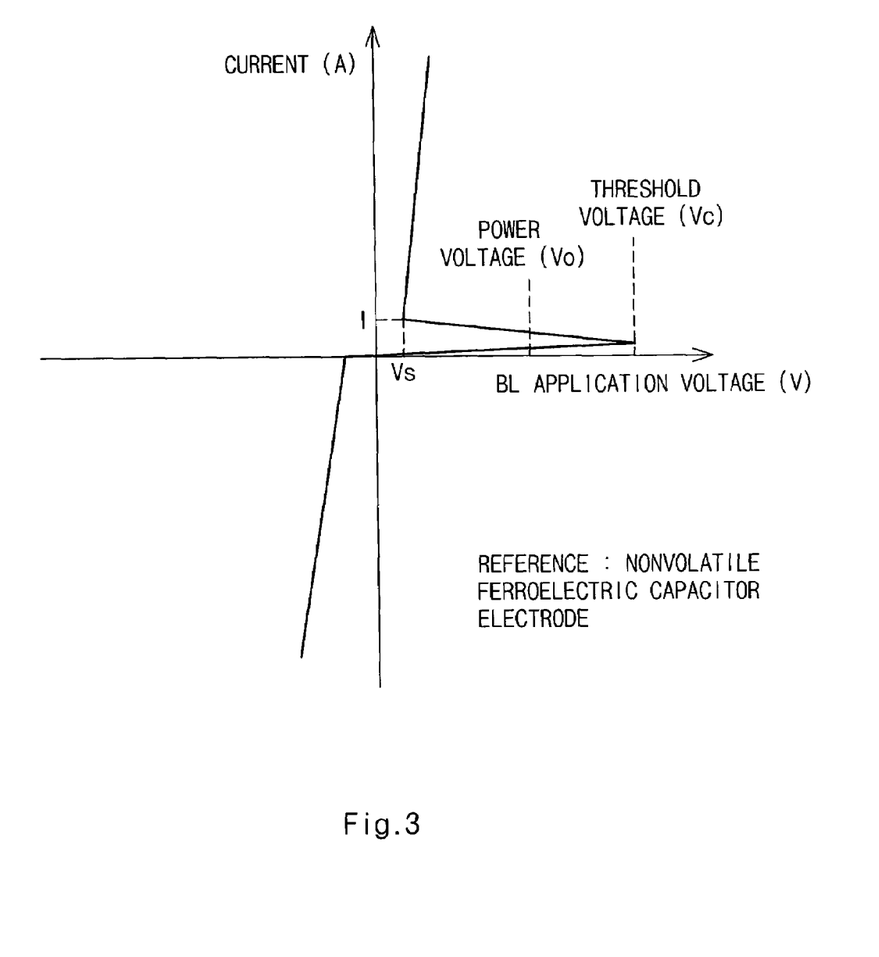
FIG. 3 is a diagram illustrating the operation of a hybrid switch of FIG. 1.

FIG. 3 is a diagram illustrating the operation of the hybrid switch HSW of FIG. 1.

When voltage of the bit line BL increases towards a positive direction on a basis of the nonvolatile ferroelectric capacitor FC, the hybrid switch HSW is kept off in an operation voltage Vo by the operation characteristic of the PNPN diode switch 2, so that current does not flow.

Thereafter, when the application voltage of the bit line BL increases to the threshold voltage Vc, the PNPN diode switch 2 is turned on by the forward operation characteristic of the diode, and the hybrid switch HSW is turned on. As a result, the current remarkably increases. Here, when the application voltage of the bit line BL is over the threshold voltage Vc, a value of current I depends on that of a resistor (not shown) that serves as a load connected to the bit line BL.

After the PNPN diode switch 2 is turned on, the current can flow although a low voltage Vs is applied to the bit line BL. Here, the PN diode switch 1 is kept off by the backward operation characteristic.

On the other hand, when the application voltage of the bit line BL increases toward a negative direction on a basis of the nonvolatile ferroelectric capacitor FC, that is, a constant voltage is applied to the word line WL, the hybrid switch HSW is turned on by the forward operation characteristic of the PN diode switch 1, so that current flows in a random operation voltage. Here, the PNPN diode switch 1 is kept off by the backward operation characteristic.

Figure 4A:
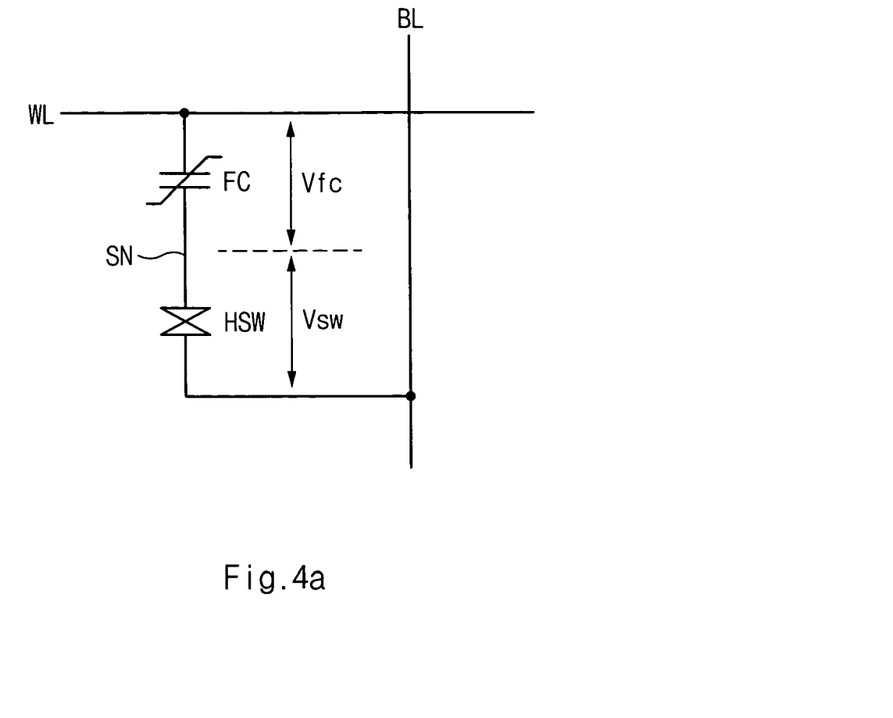
FIGS. 4a to 4c are diagrams illustrating the voltage dependency of the word line and the bit line of the nonvolatile memory device using a hybrid switch cell according to an embodiment of the present invention.
Figure 4B:
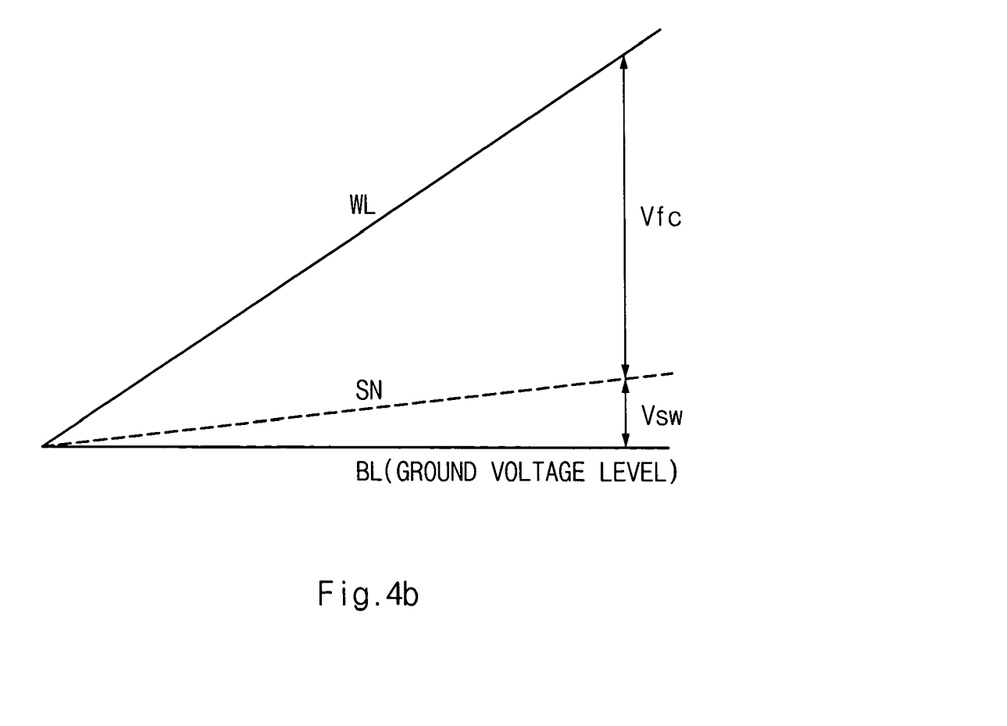
Figure 4C:
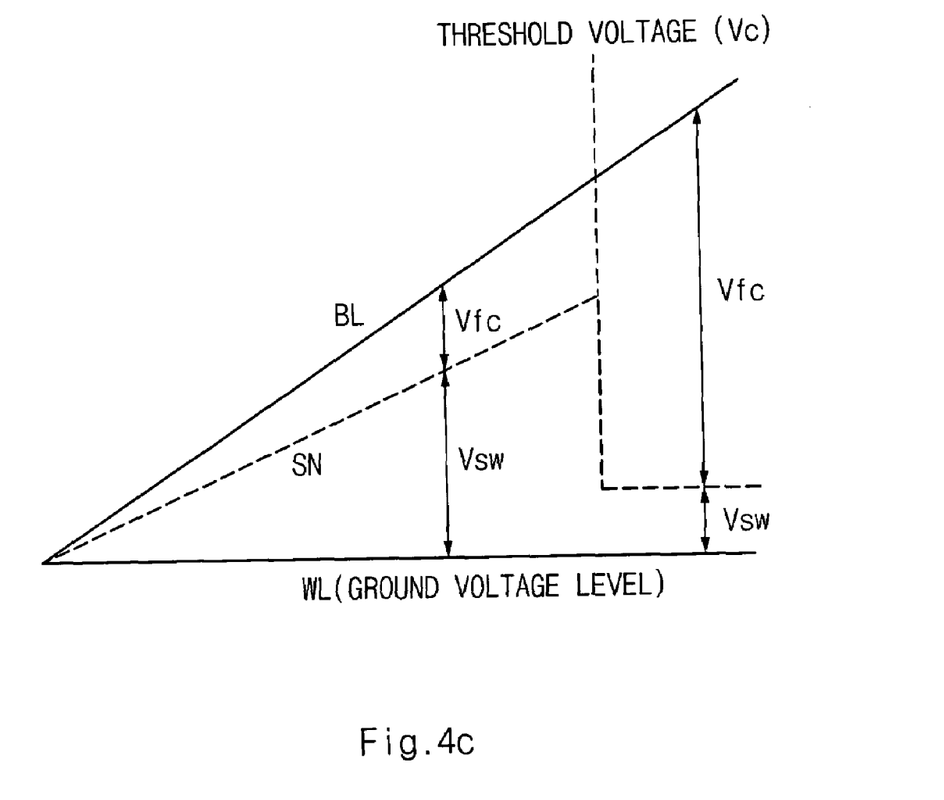

FIGS. 4a to 4c are diagrams illustrating the voltage dependency of the word line WL and the bit line BL of the nonvolatile memory device using a hybrid switch cell according to an embodiment of the present invention.

Referring to FIG. 4a, a voltage flowing in the nonvolatile ferroelectric capacitor FC connected between the word line WL and a node SN refers to a voltage Vfc, and a voltage flowing in the hybrid switch HSW connected between the node SN and the bit line BL refers to a voltage Vsw.

FIG. 4b is a diagram illustrating the voltage dependency of the word line WL in the hybrid switch cell according to an embodiment of the present invention.

When a voltage of the word line WL increases while a voltage of the bit line BL is fixed at a ground voltage level, the voltage of the word line WL is distributed in the nonvolatile ferroelectric capacitor FC and the hybrid switch HSW.

That is, when the voltage of the word line WL increases while the voltage of the bit line BL is at the ground level, the PN diode switch 1 of the hybrid switch HSW is turned on in a low voltage, so that current flows.

Here, the voltage Vsw applied to the hybrid switch HSW has a low voltage value by the forward operation of the PN diode switch 1. On the other hand, the voltage Vfc applied to the nonvolatile ferroelectric capacitor FC has a high voltage value, thereby improving the operation characteristic.

FIG. 4c is a diagram illustrating the voltage dependency of the bit line BL in the hybrid switch cell according to an embodiment of the present invention.

When the voltage of the bit line BL increases while the voltage of the word line WL is fixed at the ground voltage level, the voltage of the bit line BL is distributed in the nonvolatile ferroelectric capacitor FC and the hybrid switch HSW.

That is, when the voltage of the bit line BL increases while the voltage of the word line WL is at the ground level, the PNPN diode switch 2 of the hybrid switch HSW is kept off before the voltage of the bit line BL reaches the threshold voltage Vc. The PN diode switch 1 of the hybrid switch HSW is kept off by its backward operation characteristic. As a result, the voltage Vsw applied to the hybrid switch HSW has a high voltage value.

On the other hand, when the hybrid switch HSW is at a turn-off state, the voltage Vfc applied to the nonvolatile ferroelectric capacitor FC has a low voltage value. As a result, data stored in the nonvolatile ferroelectric capacitor FC is not changed, so that the operation is kept at a stationary state.

Thereafter, when the voltage of the bit line BL increases to be over the threshold voltage Vc, the PNPN diode switch 2 of the hybrid switch HSW is turned on. Then, most of the bit line BL voltage is distributed to the nonvolatile ferroelectric capacitor FC, so that the voltage Vfc is increased. As a result, new data can be written in the nonvolatile ferroelectric capacitor FC.

Figure 5:
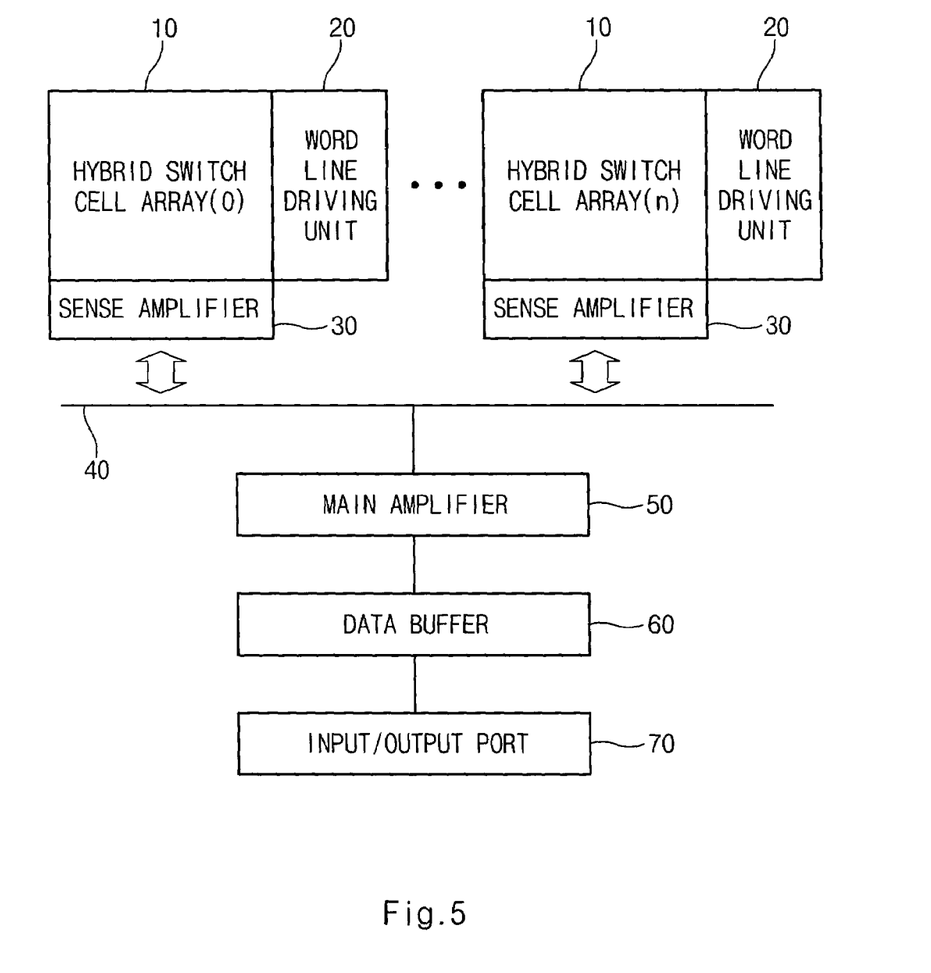
FIG. 5 is a diagram illustrating a nonvolatile memory device using a hybrid switch cell according to an embodiment of the present invention.

FIG. 5 is a diagram illustrating a nonvolatile memory device using a hybrid switch cell according to an embodiment of the present invention.

In an embodiment, the nonvolatile memory device comprises a plurality of hybrid switch cell arrays 10, a plurality of word line driving units 20, a plurality of sense amplifiers 30, a data bus 40, a main amplifier 50, a data buffer 60 and an input/output port 70.

In each hybrid switch cell array 10, a plurality of the unit hybrid switch cells shown in FIG. 1 are arranged in row and column directions. A plurality of word lines WL arranged in the row direction are connected to the word line driving unit 20. A plurality of bit lines BL arranged in the column direction are connected to the sense amplifier 30.

Here, one hybrid switch cell array 10 is correspondingly connected to one word line driving unit 20 and one sense amplifier 30.

A plurality of sense amplifiers 30 share one data bus 40. The data bus 40 is connected to the main amplifier 50 which amplifies data applied from each sense amplifier 30 through the data bus 40.

The data buffer 60 buffers the amplified data applied from the main amplifier 50. The input/output port 70 externally outputs output data applied from the data buffer 60, and applies externally applied input data to the data buffer 60.

Figure 6:
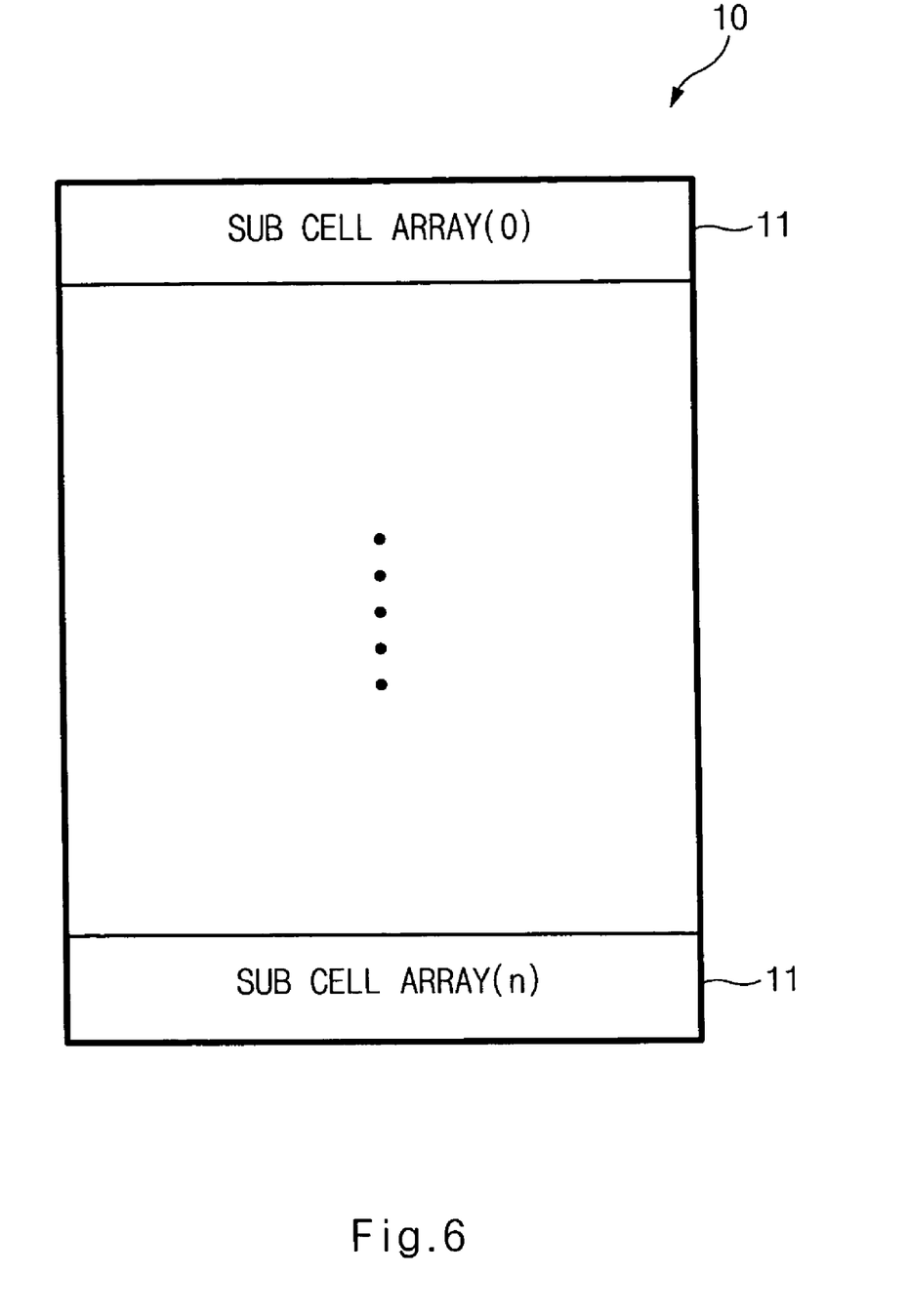
FIG. 6 is a diagram illustrating a hybrid switch cell array of FIG. 5.

FIG. 6 is a diagram illustrating the hybrid switch cell array 10 of FIG. 5.

The hybrid switch cell array 10 comprises a plurality of sub cell arrays 11 as shown in FIG. 6.

Figure 7:
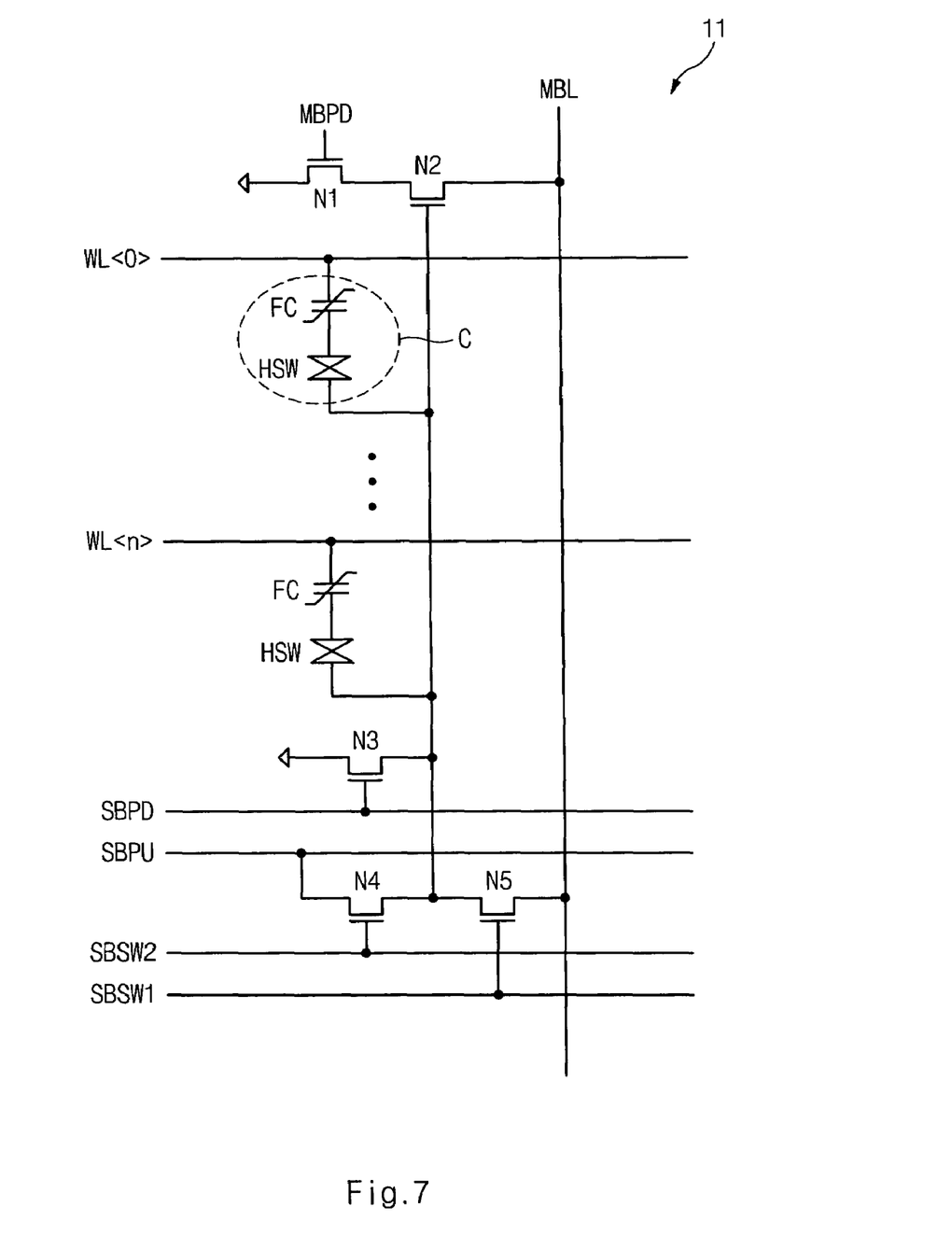
FIG. 7 is a circuit diagram illustrating a sub cell array of FIG. 6.

FIG. 7 is a circuit diagram illustrating the sub cell array 11 of FIG. 6.

The sub cell array 11 has a hierarchical bit line structure including a main bit line MBL and a sub bit line SBL. Each main bit line MBL of the sub cell array 11 is selectively connected to one of a plurality of sub bit lines SBL. That is, when one of a plurality of sub bit line selecting signals SBSW1 is activated, a corresponding NMOS transistor N5 is turned on to activate one sub bit line SBL. Also, a plurality of unit hybrid switch cells C are connected to one sub bit line SBL.

When a sub bit line pull-down signal SBPD is activated to turn on a NMOS transistor N3, the sub bit line SBL is pulled down to the ground level. The sub bit line pull-up signal SBPU is to control power supplied to the sub bit line SBL. That is, a voltage higher than a power voltage VCC is generated in a low voltage and supplied to the sub bit line SBL.

A NMOS transistor N4 controls connection between a sub bit line pull-up signal SBPU terminal and the sub bit line SBL in response to a sub bit line selecting signal SBSW2.

A NMOS transistor N2, connected between a NMOS transistor N1 and the main bit line MBL, has a gate connected to the sub bit line SBL. The NMOS transistor N1, connected between a ground voltage terminal and the NMOS transistor N2, has a gate to receive a main bit line pull-down signal MBPD, thereby regulating a sensing voltage of the main bit line MBL.

Here, the hybrid switch cell array 10 includes a plurality of word lines WL arranged in the row direction and a plurality of sub bit lines SBL arranged in the column direction, which does not require additional plate lines. Since the unit hybrid switch cell C is located where the word line WL and the sub bit line SBL are crossed, a cross point cell can be embodied which does not an additional area.

Here, the cross point cell does not comprise a NMOS transistor which uses a word line WL gate control signal. In the cross point cell, the nonvolatile ferroelectric capacitor FC is located at the cross point where the sub bit line SBL and the word line WL are crossed by using the hybrid switch HSW that comprises two connection electrode nodes.

Figure 8:
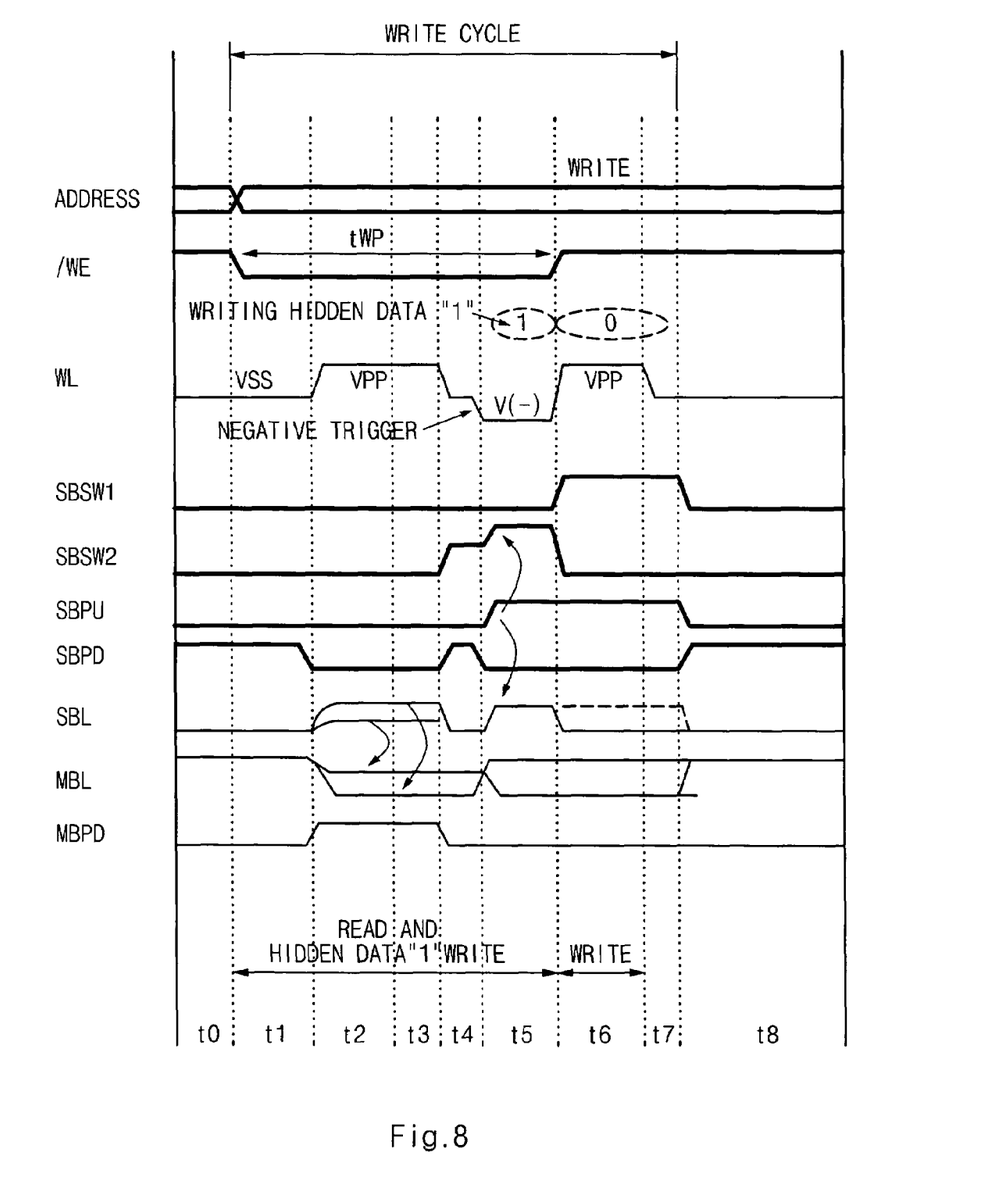
FIG. 8 is a timing diagram illustrating the write mode of the nonvolatile memory device using a hybrid switch cell according to an embodiment of the present invention.

FIG. 8 is a timing diagram illustrating the write mode of the nonvolatile memory device using a hybrid switch cell according to an embodiment of the present invention.

When a period t1 starts, if an address is inputted and a write enable signal /WE is disabled to 'low', the operation becomes at a write mode active state. In periods t0 and t1, the sub bit line pull-down signal SBPD is activated to apply the ground voltage to the sub bit line SBL, so that the sub bit line SBL is precharged to the ground level before the word line WL is activated.

Thereafter, when a period t2 starts, if the word line WL is transited to 'high', data of the hybrid switch cell are transmitted to the sub bit line SBL and the main bit line MBL. Here, the sub bit line pull-down signal SBPD is transited to 'low', and the main bit line pull-down signal MBPD is transited to 'high'. As a result, voltage levels of the sub bit line SBL and the main bit line MBL rise.

Then, when a period t4 starts, if the word line WL is transited to the ground level and the sub bit line pull-down signal SBPD is enabled, the sub bit line SBL is precharged to the ground level. Here, if the sub bit line selecting signal SBW2 is enabled, the NMOS transistor N4 is turned on to pull down the sub bit line SBL to the ground level. If the main bit line pull-down signal MBPD is transited to 'low', the voltage level of the main bit line MBL is maintained as it is.

In a period t5, the voltage of the word line WL is transited to a negative voltage. That is, a difference between the low voltage level of the sub bit line SBL and the negative voltage level of the word line WL does not reach the state of the threshold voltage Vc to turn on the PNPN diode switch 2 of the hybrid switch HSW.

However, if the sub bit line pull-up signal SBPU and the sub bit line selecting signal SBSW2 are transited to 'high', the voltage of the sub bit line SBL is amplified to 'high'. A voltage over the threshold voltage Vc to turn on the PNPN diode switch 2 is applied to the hybrid switch cell C depending on the difference between the high amplification voltage of the sub bit line SBL and the negative voltage of the word line WL. As a result, the PNPN diode switch 2 is turned on, and high data is written in the nonvolatile ferroelectric capacitor FC of the hybrid switch cell C.

Here, in the period t5, hidden data "1" is written because all high data regard less of external data are written in the hybrid switch cell C connected to the driving word line WL.

Next, when a period t6 starts, if the write enable signal /WE is transited to 'high', the operation becomes at a read mode active state. Here, the voltage level of the word line WL rises to a pumping voltage VPP level, and the sub bit line SBL is connected to the main bit line MBL when the sub bit line selecting signal SBSW1 is transited to 'high'.

At this state, when the voltage of the sub bit line SBL is transited to 'low', data "0" is written in the hybrid switch cell C. On the other hand, when the voltage of the sub bit line SBL is transited to 'high', the high data written in the period t5 is maintained as it is, so that the data "1" is written in the hybrid switch cell C. Here, the sub bit line selecting signal SBSW2 is transited to 'low', so that external data can be written in the cell.

Figure 9:
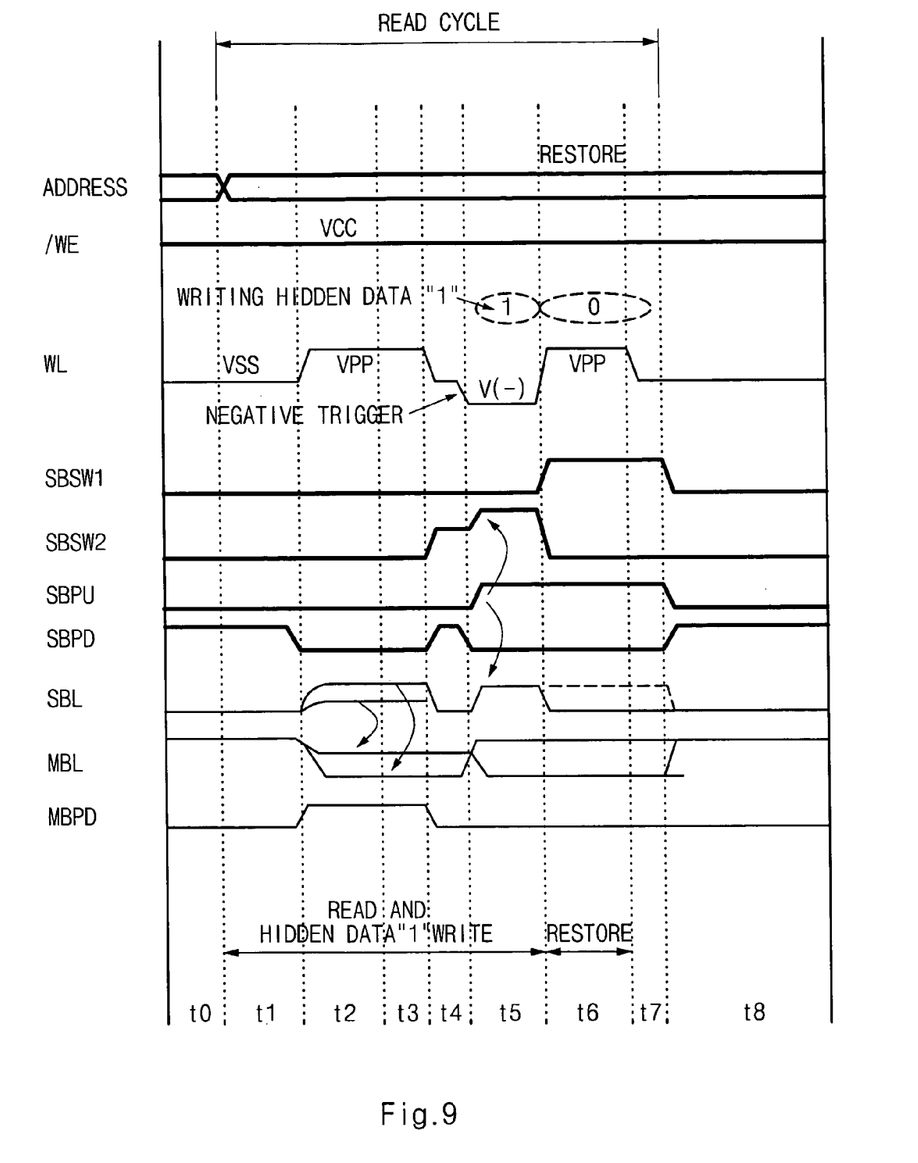
FIG. 9 is a timing diagram illustrating the read mode of the nonvolatile memory device using a hybrid switch cell according to an embodiment of the present invention.

FIG. 9 is a timing diagram illustrating the read mode of the nonvolatile memory device using a hybrid switch cell according to an embodiment of the present invention.

At the read mode, the write enable signal /WE is maintained at the power voltage VCC level. When a period t2 starts, if the word line WL is transited to the pumping VPP level, the PN diode 1 of the hybrid switch HSW is turned on. As a result, data of the hybrid switch cell C are transmitted to the sub bit line SBL and the main bit line MBL.

Here, the sub bit line pull-down signal SBPD is transited to 'low', and the main bit line pull-down signal MBPD is transited to 'high'. Then, the voltage levels of the sub bit line SBL and the main bit lien MBL rise, so that the data stored in the hybrid switch cell C can be read.

As described above, a nonvolatile memory device using a hybrid switch cell has the following effects: to provide a sub cell array using a hybrid switch which does not require an additional gate control signal in a hierarchical bit line structure including a main bit line and a sub bit line, thereby reducing the whole memory size; and to effectively drive read/write operations in the sub cell array using a hybrid switch, thereby improving operation characteristics of memory cells.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile memory device using a hybrid switch cell, comprising:
a plurality of hybrid switch cell arrays each having a hierarchical bit line structure including a plurality of sub bit lines connected to one of a plurality of main bit lines, each hybrid switch cell array including a sub cell array having a plurality of unit hybrid switch cells arranged in row and column directions between a word line and a sub bit line, wherein a voltage of the sub bit line induced by cell data is converted into current so that a sensing voltage of a main bit line is induced;
a plurality of word line driving units for selectively driving the word lines of the plurality of hybrid switch cell arrays; and
a plurality of sense amplifiers for sensing and amplifying data applied from the plurality of hybrid switch cell arrays,
wherein each of the unit hybrid switch cells comprises a nonvolatile ferroelectric capacitor whose one terminal is connected to the word line, and a hybrid switch which is connected between the other terminal of the nonvolatile ferroelectric capacitor and the sub bit line and is selectively switched depending on a voltage applied to the word line and the sub bit lines,
wherein the hybrid switch comprises:
a PN diode switch connected in a forward direction between the other terminal of the nonvolatile ferroelectric capacitor and the sub bit line, and
a PNPN diode switch connected in a backward direction between the other terminal of the nonvolatile ferroelectric capacitor and the sub bit line.

2. The nonvolatile memory device according to claim 1, further comprising:
a data bus shared by the plurality of sense amplifiers;
a main amplifier for amplifying data applied from the data bus;
a data buffer for buffering amplification data applied from the main amplifier; and
an input/output port for externally outputting output data applied from the data buffer and applying externally applied input data to the data buffer.

3. The nonvolatile memory device according to claim 1, wherein each of the plurality of hybrid switch cell arrays comprises a plurality of sub cell arrays.

4. The nonvolatile memory device according to claim 3, wherein each of the plurality of sub cell arrays comprises:
a plurality of unit hybrid switch cells each located where a plurality of word lines and a plurality of sub bit lines that are arranged in row and column directions cross each other;
a pull-up/pull-down driving switch for pulling up or pulling down the plurality of sub bit lines;
a first driving switch unit for controlling connection of the main bit line and the sub bit line; and
a second driving switch unit for pulling down the main bit line.

5. The nonvolatile memory device according to claim 1, wherein the PN diode switch has a P-type region which is connected to the other terminal of the nonvolatile ferroelectric capacitor and a N-type region which is connected to the sub bit line.

6. The nonvolatile memory device according to claim 1, wherein the PNPN diode switch has an upper N-type region which is connected to the other terminal of the nonvolatile ferroelectric capacitor and a lower P-type region which is connected to the sub bit line.

7. The nonvolatile memory device according to claim 1, wherein when the voltage level of the word line is 'high', the hybrid switch is switched to turn on the PN diode switch so that data stored in the nonvolatile ferroelectric capacitor is read, and
when the voltage level of the word line is a negative voltage and the voltage level of the sub bit line is 'high', the hybrid switch is switched to turn on the PNPN diode switch so that a hidden data is written in the nonvolatile ferroelectric capacitor.

8. A nonvolatile memory device using a hybrid switch cell, comprising:
a plurality of hybrid switch cell arrays each having a hierarchical bit line structure including a plurality of sub bit lines connected to one of a plurality of main bit lines, each hybrid switch cell array including a sub cell array having a plurality of unit hybrid switch cells arranged in row and column directions between a word line and a sub bit line, wherein a voltage of the sub bit line induced by cell data is converted into current so that a sensing voltage of a main bit line is induced,
wherein the sub cell array comprises:
a unit hybrid switch cell including a nonvolatile ferroelectric capacitor whose one terminal is connected to the word line, and a hybrid switch which is connected between the other terminal of the nonvolatile ferroelectric capacitor and the sub bit line and is selectively switched depending on a voltage applied to the word line and the sub bit line;
a pull-up/pull-down driving switch for pulling up or pulling down the sub bit line;
a first driving switch unit for controlling connection between the main bit line and the sub bit line; and a second driving switch unit for pulling down the main bit linen, wherein the hybrid switch comprises:

a PN diode switch connected in a forward direction between the other terminal of the nonvolatile ferroelectric capacitor and the sub bit line, and a PNPN diode switch connected in a backward direction between the other terminal of the nonvolatile ferroelectric capacitor and the sub bit line.

9. The nonvolatile memory device according to claim 8, wherein the PN diode switch has a P-type region which is connected to the other terminal of the nonvolatile ferroelectric capacitor and a N-type region which is connected to the sub bit line.

10. The nonvolatile memory device according to claim 8, wherein the PNPN diode switch has an upper N-type region which is connected to the other terminal of the nonvolatile ferroelectric capacitor and a lower P-type region which is connected to the sub bit line.

11. The nonvolatile memory device according to claim 8, wherein when the voltage level of the word line is 'high', the hybrid switch is switched to turn on the PN diode switch so that data stored in the nonvolatile ferroelectric capacitor is read, and when the voltage level of the word line is a negative voltage and the voltage level of the sub bit line is 'high', the hybrid switch is switched to turn on the PNPN diode switch so that a hidden data is written in the nonvolatile ferroelectric capacitor.

* * * * *